(12) United States Patent
Kwon et al.

(10) Patent No.: US 10,044,366 B2
(45) Date of Patent: Aug. 7, 2018

(54) NON-LINEAR GAMMA COMPENSATION CURRENT MODE DIGITAL-ANALOG CONVERTOR AND DISPLAY DEVICE INCLUDING THE SAME

(71) Applicants: Samsung Display Co., Ltd., Yongin, Gyeonggi-do (KR); Korea Advanced Institute of Science and Technology, Daejeon-dong (KR)

(72) Inventors: Oh Jo Kwon, Suwon-si (KR); Kyung Youl Min, Hwaseong-si (KR); Choong Sun Shin, Yongin-si (KR); Hee Sun Ahn, Suwon-si (KR); Hyun Sik Kim, Daejeon (KR); Jun Suk Bang, Daejeon (KR); Gyu Hyeong Cho, Daejeon (KR)

(73) Assignees: Samsung Display Co., Ltd., Yongin-si (KR); Korea Advanced Institute of Science and Technology, Daejeon-dong (KR)

( * ) Notice: Subject to any disclaimer, the term of this patent is extended or adjusted under 35 U.S.C. 154(b) by 378 days.

(21) Appl. No.: 14/218,952

(22) Filed: Mar. 18, 2014

(65) Prior Publication Data
US 2015/0091784 A1  Apr. 2, 2015

(30) Foreign Application Priority Data
Sep. 27, 2013  (KR) ........................ 10-2013-0115348

(51) Int. Cl.
  G09G 3/32   (2016.01)
  H03M 1/72   (2006.01)
  G09G 3/3275 (2016.01)

(52) U.S. Cl.
  CPC .......... *H03M 1/72* (2013.01); *G09G 3/3275* (2013.01); *G09G 2320/0276* (2013.01); *G09G 2320/043* (2013.01); *G09G 2320/0673* (2013.01)

(58) Field of Classification Search
  CPC ........ G09G 2320/0276; G09G 3/3685; H03M 1/664
  See application file for complete search history.

(56) References Cited

U.S. PATENT DOCUMENTS 5,689,260 A * 11/1997 Vallancourt .......... H03M 1/164
                                                     341/156
5,870,049 A *  2/1999 Huang .................. H03M 1/68
                                                     341/144

(Continued)

FOREIGN PATENT DOCUMENTS

KR    10-0658619 B1    12/2006
KR    10-0691362 B1     3/2007

(Continued)

*Primary Examiner* — Dorothy Harris
(74) *Attorney, Agent, or Firm* — Lewis Roca Rothgerber Christie LLP

(57) ABSTRACT

A non-linear gamma compensation current mode digital-analog converter includes: a first digital-analog converter block configured to: receive a digital signal, a first reference voltage, and a gamma adjustment voltage, and provide a reference current to a ground, wherein a first current flowing to a first current output terminal is determined according to the digital signal and the gamma adjustment voltage; and a second digital-analog converter block configured to: receive the digital signal, a second reference voltage, and a ground voltage, and provide the first current to the first digital-analog converter, wherein a second current flowing to a second current output terminal is determined according to the digital signal and the first current.

20 Claims, 5 Drawing Sheets

(56) References Cited

U.S. PATENT DOCUMENTS

| | | | | |
|---|---|---|---|---|
| 5,905,452 | A * | 5/1999 | Baek | H03M 1/742 341/136 |
| 7,580,011 | B2 * | 8/2009 | Toyoshima | G09G 3/325 345/690 |
| 7,696,909 | B2 * | 4/2010 | Oberhuber | G05F 3/30 327/307 |
| 2006/0077143 | A1 * | 4/2006 | Kwon | G09G 3/3208 345/77 |
| 2006/0238473 | A1 * | 10/2006 | Hashimoto | G09G 3/3688 345/89 |
| 2007/0132621 | A1 * | 6/2007 | Choi | G09G 3/3291 341/144 |
| 2010/0141498 | A1 * | 6/2010 | Lee | H03M 1/664 341/154 |
| 2010/0207967 | A1 * | 8/2010 | Baek | G09G 3/3685 345/690 |

FOREIGN PATENT DOCUMENTS

| | | |
|---|---|---|
| KR | 10-2008-0097668 A | 11/2008 |
| KR | 10-2008-0105977 A | 12/2008 |

* cited by examiner

NON-LINEAR GAMMA COMPENSATION CURRENT MODE DIGITAL-ANALOG CONVERTOR AND DISPLAY DEVICE INCLUDING THE SAME

CROSS-REFERENCE TO RELATED APPLICATION

This application claims priority to and the benefit of Korean Patent Application No. 10-2013-0115348 filed in the Korean Intellectual Property Office on Sep. 27, 2013, the entire contents of which are incorporated herein by reference.

BACKGROUND

1. Field

Embodiments of the present invention relate to a non-linear gamma compensation current mode digital-analog converter and a display device including the same.

2. Description of the Related Art

The organic light emitting diode (OLED) display device uses OLEDs in which a luminance is controlled by a current or a voltage. Each of the OLEDs includes an anode layer and a cathode layer, which form an electric field, and an organic light emitting material, which emits light because of the electric field.

In general, OLED display devices are classified into a passive matrix OLED (PMOLED) and an active matrix OLED (AMOLED) in accordance with a method of driving OLEDs. The PMOLED display is driven by forming positive electrodes and negative electrodes that cross in a matrix and selecting a line. The AMOLED display is driven by coupling a thin film transistor and a capacitor to the organic light emitting diode and maintaining the voltage by the capacitor. Depending on the type of signal applied to the capacitor to maintain the voltage, the AMOLED method may be classified into a voltage programming method or a current programming method.

However, a pixel circuit according to a conventional voltage programming method has the disadvantage of expressing high-level gray levels due to variations of a threshold voltage of the thin film transistor and mobility of a carrier, the deviation being generated as a result of a non-uniform manufacturing process of the thin film transistor. On the other hand, although the amount of current and voltage supplied from a driving transistor in each of the pixels is not uniform, the pixel circuit employing the current programming method can provide panel uniformity as long as current supplied from a current source to the pixel circuits is uniform.

When utilizing a display device by using the pixel circuit that employs the current programming method, a digital-analog converter is required to convert gray level data into gray level current to apply the gray level current to the pixel circuit. When converting the gray level data into the gray level current, the digital-analog converter must perform a gamma correction for the gray level data by considering the gamma characteristic of the display panel.

The gamma characteristic of the display panel is non-linear for the gray level data, and in contrast, the conventional digital-analog converter outputs a linear gray level current for the gray level data. In this case, the display panel may not display the image of the desired gray level and display quality may be deteriorated.

The above information disclosed in this Background section is only for enhancement of understanding of the background of the invention and therefore it may contain information that does not form the prior art that is already known to a person of ordinary skill in the art.

SUMMARY

Aspects of embodiments of the present invention provide a non-linear gamma compensation current mode digital-analog converter outputting a gray level current performed with non-linear gamma compensation and a display device including the same.

According to an aspect of embodiments of the present invention, a non-linear gamma compensation current mode digital-analog converter includes: a first digital-analog converter block configured to: receive a digital signal, a first reference voltage, and a gamma adjustment voltage; and provide a reference current to a ground, wherein a first current flowing to a first current output terminal is determined according to the digital signal and the gamma adjustment voltage; and a second digital-analog converter block configured to: receive the digital signal, a second reference voltage, and a ground voltage; and provide the first current to the first digital-analog converter, wherein a second current flowing to a second current output terminal is determined according to the digital signal and the first current.

The first digital-analog converter block may include: a plurality of first switches coupled to the first current output terminal; a plurality of second switches coupled to a power source voltage; and a plurality of bit current transistors including a gate electrode coupled to the first reference voltage, and the plurality of bit current transistors may be coupled between: the plurality of first switches and the plurality of second switches; and a reference current terminal configured to receive the reference current.

The first digital-analog converter block may further include a unit current transistor including a gate electrode coupled to the first reference voltage, and the unit current transistor may be coupled between the power source voltage and the reference current terminal.

The first digital-analog converter block may further include a gamma adjustment transistor including a gate electrode coupled to the gamma adjustment voltage, and the gamma adjustment transistor may be coupled between the first current output terminal and the reference current terminal.

The plurality of first switches may be configured to be turned on/off in response to the digital signal and the plurality of second switches may be configured to be turned on/off in response to a reverse phase signal of the digital signal.

The unit current transistor may be configured to provide the unit current according to the reference voltage.

The plurality of bit current transistors may be configured to provide a current of $2^{n-1}$ times the unit current according to positions arranged corresponding to the digital signal.

A ratio of a channel width and a channel length of the plurality of bit current transistor may be $2^{n-1}$ times a ratio of a channel width and a channel length of the unit current transistor according to positions arranged corresponding to the digital signal.

A ratio of a channel width and a channel length of the gamma adjustment transistor may be $2^n$ times the ratio of a channel width and a channel length of the unit current transistor.

The second digital-analog converter block may include a same arrangement as the first digital-analog converter block, and the gate electrode of the gamma adjustment transistor of the second digital-analog converter block may be configured to receive the ground voltage.

The gamma adjustment voltage may be adjusted with a ratio of which the reference current is divided into a current flowing to the plurality of bit current transistors and a current flowing to the gamma adjustment transistor.

The non-linear gamma compensation current mode digital-analog converter may further include a third digital-analog converter block configured to receive the digital signal, a third reference voltage, and a ground voltage, and to output the second current to the second digital-analog converter, and a third current provided to a third current output terminal may be determined according to the digital signal and the second current.

According to an aspect of embodiments of the present invention, a display device includes: a plurality of pixels; and a data driver including a digital-analog converter configured to convert a digital image signal into an analog gray level current and to apply the gray level current to a plurality of data lines coupled to the plurality of pixels, wherein the digital-analog converter includes a first digital-analog converter block configured to receive the image signal, a first reference voltage, and a gamma adjustment voltage, and to output a reference current to a ground, wherein a first current provided to a first current output terminal is determined according to the image signal and the gamma adjustment voltage; and a second digital-analog converter block configured to receive the image signal, a second reference voltage, and a ground voltage and to output the first current to the first digital-analog converter, wherein a second current provided to a second current output terminal is determined according to the image signal and the first current.

The first digital-analog converter block may include: a plurality of first switches coupled to the first current output terminal; a plurality of second switches coupled to a power source voltage; and a plurality of bit current transistors including a gate electrode coupled to the first reference voltage and coupled between the plurality of first switches and the plurality of second switches, and a reference current terminal configured to receive the reference current.

The first digital-analog converter block may further include a unit current transistor including a gate electrode coupled to the first reference voltage and coupled between the power source voltage and the reference current terminal.

The first digital-analog converter block may further include a gamma adjustment transistor including a gate electrode coupled to the gamma adjustment voltage and coupled between the first current output terminal and the reference current terminal.

The plurality of first switches may be configured to be turned on/off in response to the digital signal and the plurality of second switches may be configured to be turned on/off in response to a reverse phase signal of the digital signal.

The unit current transistor may be configured to provide the unit current according to the reference voltage.

The gamma adjustment voltage may be adjusted with a ratio of which the reference current is divided into a current flowing to the plurality of bit current transistors and a current provided to the gamma adjustment transistor.

The digital-analog converter may further include a third digital-analog converter block configured to receive the digital signal, a third reference voltage, and a ground voltage and to provide the second current to the second digital-analog converter, and a third current flowing to a third current output terminal may be determined according to the digital signal and the second current.

The gray level current in which the non-linear gamma compensation is performed may be generated without an additional LUT (look-up table).

DETAILED DESCRIPTION

Figure 1:
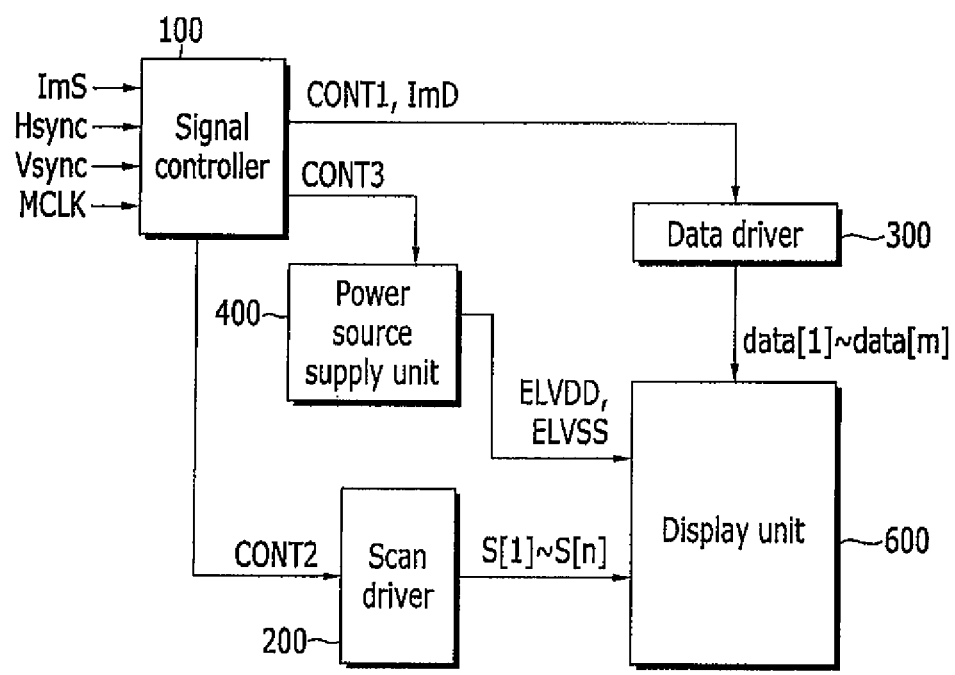
FIG. 1 is a block diagram of a display device according to an example embodiment of the present invention.

Aspects of embodiments of the present invention will be described more fully hereinafter with reference to the accompanying drawings, in which example embodiments of the invention are shown. As those skilled in the art would realize, the described embodiments may be modified in various different ways, all without departing from the spirit or scope of the present invention.

Furthermore, with example embodiments of the present invention, a detailed description is given of the constituent elements in the first example embodiment with reference to the relevant drawings by using the same reference numerals for the same constituent elements, while only constituent elements that are different from those related to the first example embodiment are described in other example embodiments.

Some parts that are irrelevant to the description are omitted in order to clearly describe the present invention, and like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a block diagram of a display device according to an example embodiment of the present invention.

Referring to FIG. 1, the display device 10 includes a signal controller 100, a scan driver 200, a data driver 300, a power source supply unit 400, and a display unit 600.

The signal controller 100 receives a video signal ImS and a synchronization signal input from an external device. The input video signal ImS includes luminance information for a plurality of pixels. The luminance corresponds to a number of gray level data (e.g., a predetermined number of gray level data, for example $1024=2^{10}$, $256=2^8$, or $64=2^6$). The synchronization signal includes a horizontal synchronization signal Hsync, a vertical synchronization signal Vsync, and a main clock signal MCLK.

The signal controller 100 generates first to third driving control signals CONT1, CONT2, and CONT3 and an image data signal ImD according to the video signal ImS, the horizontal synchronization signal Hsync, the vertical synchronization signal Vsync, and the main clock signal MCLK. The signal controller 100 generates the image data signal ImD by dividing the video signal ImS into a frame unit according to the vertical synchronization signal Vsync and dividing the image data signal ImS into a scan line unit according to the horizontal synchronization signal Hsync. The signal controller 100 transmits the image data signal ImD along with the first driving control signal CONT1 to the data driver 300.

The display unit 600 includes a display area including a plurality of pixels. The display unit 600 includes a plurality of scan lines extending (or substantially extending) in a row direction and parallel (or substantially parallel) with each other. The display unit 600 further includes plurality of data lines, and a plurality of power source lines extending (or substantially extending) in a column direction and parallel (or substantially parallel) with each other. The scan lines, the data lines, and the power source lines are coupled to the plurality of pixels. The plurality of pixels are arranged (e.g., substantially arranged) in a matrix format.

The scan driver 200 is coupled to a plurality of scan lines and generates a plurality of scan signals S[1]-S[n] according to the second driving control signal CONT2. The scan driver 200 may sequentially apply the scan signals S[1]-S[n] of the gate-on voltage to a plurality of scan lines.

The data driver 300 is coupled to a plurality of data lines, samples and holds the image data signal ImD input according to the first driving control signal CONT1, and respectively transmits a plurality of data signals data[1]-data[m] to a plurality of data lines. The image data ImD is a digital signal. The data driver 300 includes at least one digital-analog converter converting the image data ImD into an analog gray level current and generates the gray level current corresponding to the image data ImD. The gray level current is output as the data signals data[1]-data[m].

The power source supply unit 400 supplies the first power source voltage ELVDD and the second power source voltage ELVSS to a plurality of power source lines coupled to a plurality of pixels. The first power source voltage ELVDD and the second power source voltage ELVSS provide the driving current of the pixel. The power source supply unit 400 may change a voltage level of at least one of the first power source voltage ELVDD or the second power source voltage ELVSS according to the third driving control signal CONT3.

Next, the digital-analog converter included in the data driver 300 will be described.

Figure 2:
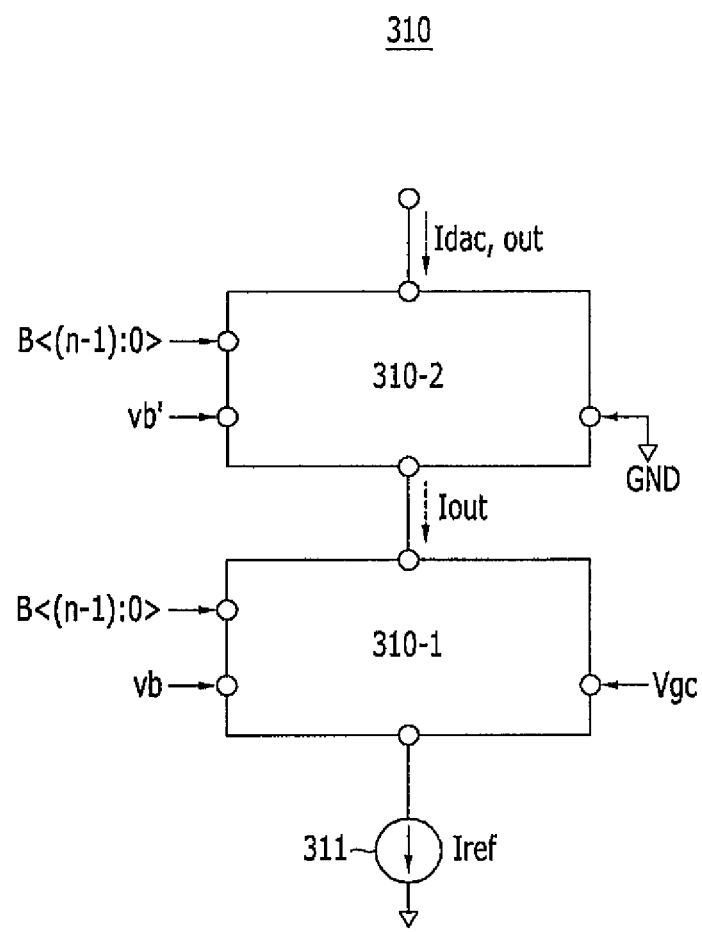
FIG. 2 is a block diagram of a non-linear gamma compensation current mode digital-analog converter according to an example embodiment of the present invention.
Figure 3:
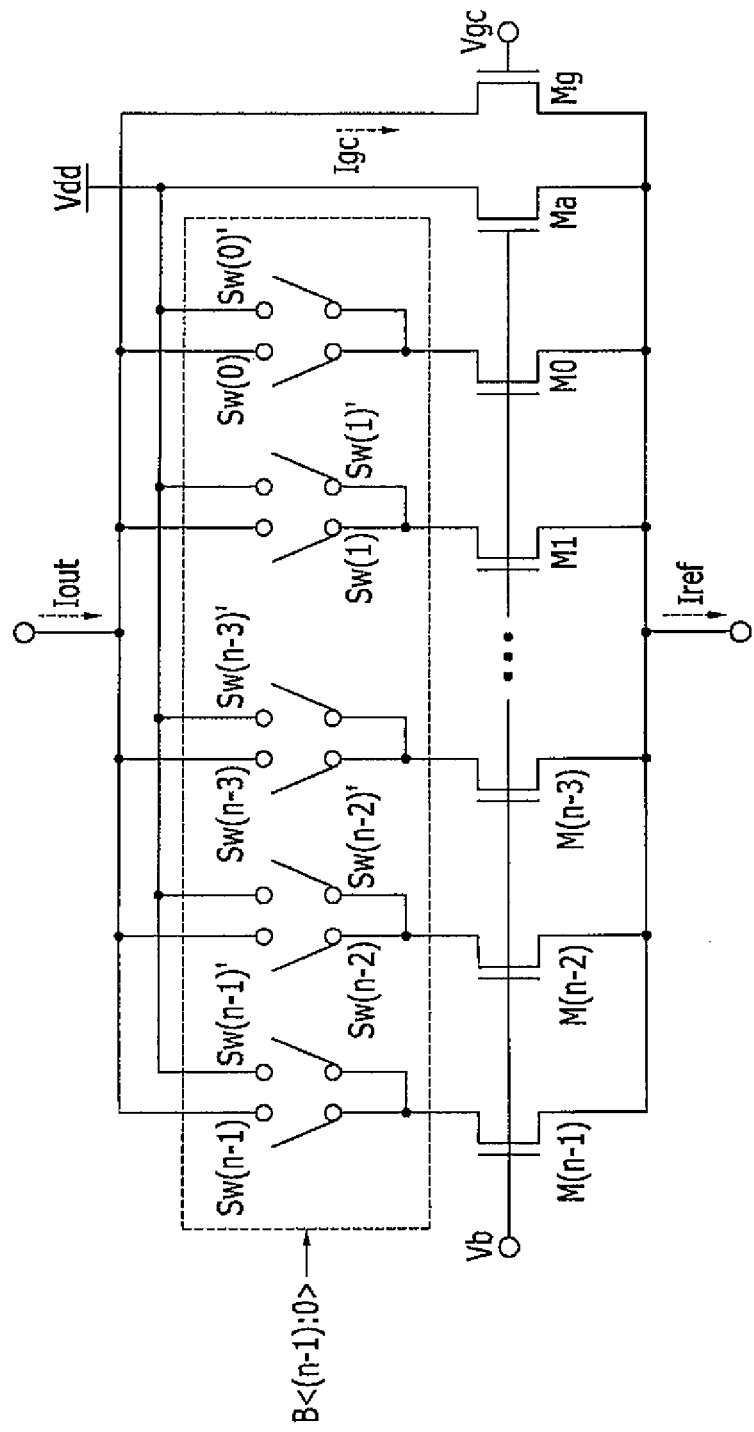
FIG. 3 is a circuit diagram of a digital-analog converter block according to an example embodiment of the present invention.

FIG. 2 is a block diagram of a non-linear gamma compensation current mode digital-analog converter according to an example embodiment of the present invention. FIG. 3 is a circuit diagram of a digital-analog converter block according to an example embodiment of the present invention.

Referring to FIGS. 2 and 3, the non-linear gamma compensation current mode digital-analog converter 310 includes a first digital-analog converter block 310-1 and a second digital analog converter block 310-2.

The first digital-analog converter block 310-1 is input with (e.g., receives) an n bit digital signal (B<(n−1):0), a first reference voltage Vb, and a gamma adjustment voltage Vgc. The n bit digital signal (B<(n−1):0) may be an n bit image data ImD. The first digital-analog converter block 310-1 is coupled to a bias circuit 311 providing a reference current Iref (e.g., a reference current having a predetermined magnitude) to a ground, and thereby the reference current Iref flows to the ground from the first digital-analog converter block 310-1 through the bias circuit 311.

The second digital-analog converter block 310-2 is input with (e.g., receives) the n bit digital signal (B<(n−1):0), a second reference voltage Vb', and a ground voltage GND. The same n bit digital signal (B<(n−1):0) may be input or provided to the first digital-analog converter block 310-1 and the second digital-analog converter block 310-2. The second reference voltage Vb' may be set as a different level voltage from the first reference voltage Vb or the same level voltage as the first reference voltage Vb. The first reference voltage Vb and the second reference voltage Vb' may be a constant voltage.

A first current Iout flows from the second digital-analog converter block 310-2 to the current output terminal of the first digital-analog converter block 310-1. Also, a second current Idac,out flows to the current output terminal of the second digital-analog converter block 310-2.

A current amount of the first current Iout is determined by the n bit digital signal (B<(n−1):0)) input to the first digital-analog converter block 310-1, the gamma adjustment voltage Vgc, and the reference current Iref. The reference current Iref is determined as the constant current amount such that the current amount of the first current Iout is determined by the n bit digital signal (B<(n−1):0) and the gamma adjustment voltage Vgc.

The current amount of the second current Idac,out is determined by the n bit digital signal (B<(n−1):0)) input to the second digital-analog converter block 310-2 and the first current Iout. The current amount of the first current Iout is determined by the n bit digital signal (B<(n−1):0) and the gamma adjustment voltage Vgc, and accordingly the current amount of the second current Idac,out is changed into a non-linear gamma shape for the n bit digital signal (B<(n−1):0).

The second current Idac,out is output as the gray level current of the display device 10. That is, a gray level current may be generated based on the non-linear gamma compensation that is performed through the non-linear gamma compensation current mode digital-analog converter 310. Accordingly, the data driver 300 does not need an additional LUT (look-up table) for the gamma compensation.

Now, the configuration of the first digital-analog converter block 310-1 and the second digital-analog converter block 310-2 will be described in some detail.

The first digital-analog converter block 310-1 includes a plurality of switches Sw(0)-Sw(n−1) and Sw(0)'-Sw(n−1)' and a plurality of transistors Mg, Ma, and M(0)-M(n−1).

A plurality of switches Sw(0)-Sw(n−1) and Sw(0)'-Sw(n−1)' include a plurality of first switches Sw(0)-Sw(n−1) that are turned on/off in response to the n bit digital signal (B<(n−1):0) and a plurality of second switch Sw(0)'-Sw(n−1)' that are turned on/off in response to a reverse phase signal of the n bit digital signal (B<(n−1):0). For example, in the n bit digital signal (B<(n−1):0), through a method in which the bit value of an LSB (least significant bit) is input to the switch Sw(0) and the bit value of a most significant bit (MSB) is input or provided to the switch Sw(n−1), the bit value of the n bit digital signal(B<(n−1):0) is input or provided to the switches Sw(0)-Sw(n−1) of the corresponding positions. Also, in the reverse phase signal of the n bit digital signal(B<(n−1):0), through a method in which the bit value of the LSB is input or provided to the switch Sw(0)' and the bit value of the MSB is input or provided to the switch Sw(n−1)', the bit value of the reverse phase signal of the n bit digital signal (B<(n−1):0) is input or provided to the switches Sw(0)'-Sw(n−1)' of the corresponding positions. The plurality of switches Sw(0)-Sw(n−1) and Sw(0)'-Sw(n−1)' are turned on when the input bit value is 1 and are turned off when the input bit value is 0.

A plurality of transistors Mg, Ma, and M(0)-M(n−1) include a gamma adjustment transistor Mg, a unit current transistor Ma, and a plurality of bit current transistors M(0)-M(n−1).

The gamma adjustment transistor Mg includes a gate electrode configured to receive the gamma adjustment voltage Vgc, one electrode (e.g., a source or drain electrode) coupled to the current output terminal to which the first current Iout flows, and the other electrode (e.g., a drain or source electrode) coupled to the reference current terminal to which the reference current Iref flows.

The unit current transistor Ma includes the gate electrode coupled to the reference voltage Vb, one electrode (e.g., a source or drain electrode) coupled to the power source voltage Vdd, and the other electrode (e.g., a drain or source electrode) coupled to the reference current terminal.

A plurality of bit current transistors M(0)-M(n−1) respectively include the gate electrode coupled to the reference voltage Vb, one electrode (e.g., a source or drain electrode) coupled to a plurality of switches Sw(0)-Sw(n−1) and, Sw(0)'-Sw(n−1)', and the other electrode (e.g., a drain or source electrode) coupled to the reference current terminal.

A plurality of first switches Sw(0)-Sw(n−1) respectively couple the current output terminal and a plurality of bit current transistors M(0)-M(n−1). A plurality of second switch Sw(0)'-Sw(n−1)' respectively couple the power source voltage Vdd and a plurality of bit current transistors M(0)-M(n−1).

The unit current transistor Ma is turned on to enable flow of the unit current I in response to the reference voltage Vb.

A plurality of bit current transistors M(0)-M(n−1) are turned on to enable the flow the current equal to about $2^{n-1}$ times the unit current I according to the arranged positions corresponding to the n bit digital signal (B<(n−1):0). In a plurality of bit current transistors M(0)-M(n−1), the first bit current transistor M(0) is configured to enable the flow of current equal to about $2^0$ times the unit current I. The second bit current transistor M1 is configured to enable the flow of current equal to about $2^1$ times of the unit current I. The current amount flowing through this method is increased such that the n bit current transistor M(n−1) is configured to enable the flow of current equal to about $2^{n-1}$ times.

For the plurality of bit current transistor M(0)-M(n−1), a ratio W/L of a channel width and a channel length according to the arranged position corresponding to the n bit digital signal (B<(n−1):0) may be set as $2^{n-1}$ times the ratio W/L of the channel width and the channel length of the unit current transistor Ma. The ratio W/L of the channel width and the channel length of the first bit current transistor M(0) is set to be equal to the unit current transistor Ma, the ratio W/L of the channel width and the channel length of the second bit current transistor M1 is set as $2^1$ of the unit current transistor Ma, the ratio W/L of the channel width and the channel is increased according to this method, and the ratio W/L of the channel width and the channel length of the n bit current transistor M(n−1) may be set as $2^{n-1}$ times the unit current transistor Ma.

The ratio W/L of the channel width and the channel length of the gamma adjustment transistor Mg may be set as $2^n$ times the unit current transistor Ma. The gamma adjustment transistor Mg is configured to enable the flow of the gamma adjustment current Igc corresponding to the gamma adjustment voltage Vgc.

The first current Iout may be determined according to Equation 1, below, based on the n bit digital signal (B<(n−1):0) and the gamma adjustment voltage Vgc.

$$Iout = Igc + (Iref - Igc)\frac{1}{2^n}\sum_{k=0}^{n-1} 2^k \cdot B[k] \qquad \text{Equation 1}$$

If the gamma adjustment voltage Vgc is increased above a voltage (e.g., to more than a predetermined voltage), the gamma adjustment transistor Mg is turned on to enable the gamma adjustment current Igc corresponding to the gamma adjustment voltage Vgc to flow. Accordingly, the first current Iout is changed.

The gamma adjustment current Igc is controlled by (or is a function of) the gamma adjustment voltage Vgc. The gamma adjustment current Igc may be determined based on Equation 2, below, according to a range of the gamma adjustment voltage Vgc.

$$Igc = 0, \qquad \text{Equation 2}$$

when $$Vgc < Vb - \sqrt{\frac{2Iref}{\mu_n C \, 2^n W/L}}$$

$$Igc = \frac{Iref}{2} + \sqrt{\mu_n C \frac{2^n W}{L} Iref} \left(\frac{Vgc - Vb}{2}\right),$$

when $$Vb - \sqrt{\frac{2Iref}{\mu_n C \, 2^n W/L}} \leq Vgc \leq Vb + \sqrt{\frac{2Iref}{\mu_n C \, 2^n W/L}}$$

$$Igc = Iref,$$

when $$Vb + \sqrt{\frac{2Iref}{\mu_n C \, 2^n W/L}} < Vgc$$

Here, $\mu_n$ is mobility of the transistor and C is equivalent capacitance of the transistor.

When the gamma adjustment voltage Vgc is very much lower than the reference voltage Vb, the reference current Iref mainly flows through the bit current transistors M(0)-M(n−1). Accordingly, the first digital-analog converter block 310-1 functions as the linear digital-analog converter.

In contrast, when the gamma adjustment voltage Vgc is similar to the reference voltage Vb, the reference current Iref is divided into and flows to the bit current transistors M(0)-M(n−1) and the gamma adjustment transistor Mg.

When the gamma adjustment voltage Vgc is very much larger than the reference voltage Vb, the reference current Iref mainly flows through the gamma adjustment transistor Mg.

As described above, by adjusting the gamma adjustment voltage Vgc, the ratio of which the reference current Iref is divided into the current flowing to the bit current transistor M(0)-M(n−1) and the current flowing to the current and gamma adjustment transistor Mg may be adjusted.

The second digital-analog converter block 310-2 may have a same arrangement as the first digital-analog converter block 310-1. That is, the second digital-analog converter block 310-2 may include a plurality of switches Sw(0)-Sw(n−1) and Sw(0)'-Sw(n−1)' and a plurality of transistors Mg, Ma, and M(0)-M(n−1), arranged in a same configuration as the first digital-analog converter block 310-1. Some of the repetitive description of the arrangement of the plurality of switches Sw(0)-Sw(n−1) and Sw(0)'-Sw(n−1)' and the plurality of transistors Mg, Ma, and M(0)-M(n−1) of the second digital-analog converter block 310-2 that is the same as for the first digital-analog converter block 310-1 is therefore omitted.

However, the gate electrode of the gamma adjustment transistor Mg of the second digital-analog converter block 310-2 is coupled to the ground voltage (GND). As the gate electrode of the gamma adjustment transistor Mg is coupled to the ground (GND), the gamma adjustment current Igc does not flow through the gamma adjustment transistor Mg.

The first current Iout determined in the first digital-analog converter block 310-1 becomes the reference current of the second digital-analog converter block 310-2. The gamma adjustment current Igc becomes 0 such that the second current Idac,out of the current output terminal of the second digital-analog converter block 310-2 is determined according to Equation 3.

$$Idac, out = \frac{Iout}{2^n}\sum_{k=0}^{n-1} 2^k \cdot B[k] \qquad \text{Equation 3}$$

If the first current Iout determined in the first digital-analog converter block 310-1 of Equation 1 is substituted to Equation 3, Equation 4 may be obtained.

$$Idac, out = \left[Igc + (Iref - Igc)\frac{1}{2^n}\sum_{k=0}^{n-1} 2^k \cdot B[k]\right]\frac{1}{2^n}\sum_{k=0}^{n-1} 2^k \cdot B[k] \qquad \text{Equation 4}$$

Equation 5 may be obtained by summarizing Equation 4.

$$Idac, out = Iref[(1-\alpha)X^2 + \alpha X], \qquad \text{Equation 5}$$

where $$X = \frac{1}{2^n}\sum_{k=0}^{n-1} 2^k \cdot B[k],$$

$$Igc = \alpha Iref (0 \leq \alpha \leq 1)$$

Here, X represents the n bit digital signal (B<(n−1):0), and α is determined by the gamma adjustment voltage Vgc.

As shown in Equation 5, the second current Idac,out has the non-linear output of a type of the gamma shape. Particularly, a linear function and a quadratic function have different weight values according to an α value. If α is 0, a relation of the input and the output has a generally square shape and the relation of the input and the output becomes the complete gamma, and this becomes a γ=2 gamma curve. If α is 1, the quadratic function is removed and the equation is summarized as the linear function such that the complete linear γ=1 gamma curve is obtained. That is, the gamma adjustment voltage Vgc is controlled to adjust the α value to be between 0 and 1 such that the weight value of the linear function and the quadratic function may be controlled, and accordingly, it may be set that the gamma value between the relation of the input and the output between 1 and 2.

Figure 4:
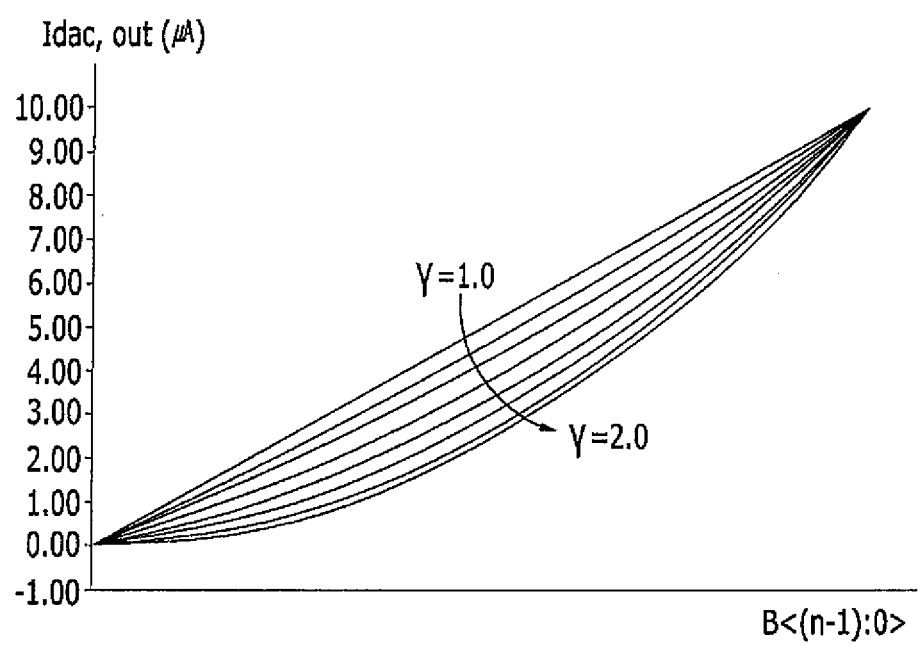
FIG. 4 is a graph of a gamma curve of a non-linear gamma compensation current mode digital-analog converter included in a data driver according to an example embodiment of the present invention.

FIG. 4 is a graph of a gamma curve of a non-linear gamma compensation current mode digital-analog converter according to an example embodiment of the present invention.

Referring to FIG. 4, there is a simulation result of the gamma curve by controlling the gamma adjustment voltage Vgc in the non-linear gamma compensation current mode digital-analog converter 310. By controlling the gamma adjustment voltage Vgc, it may be confirmed that the gamma curve of the second current Idac,out for the n bit digital signal (B<(n−1):0) may be set between 1 and 2 as the gamma value.

Figure 5:
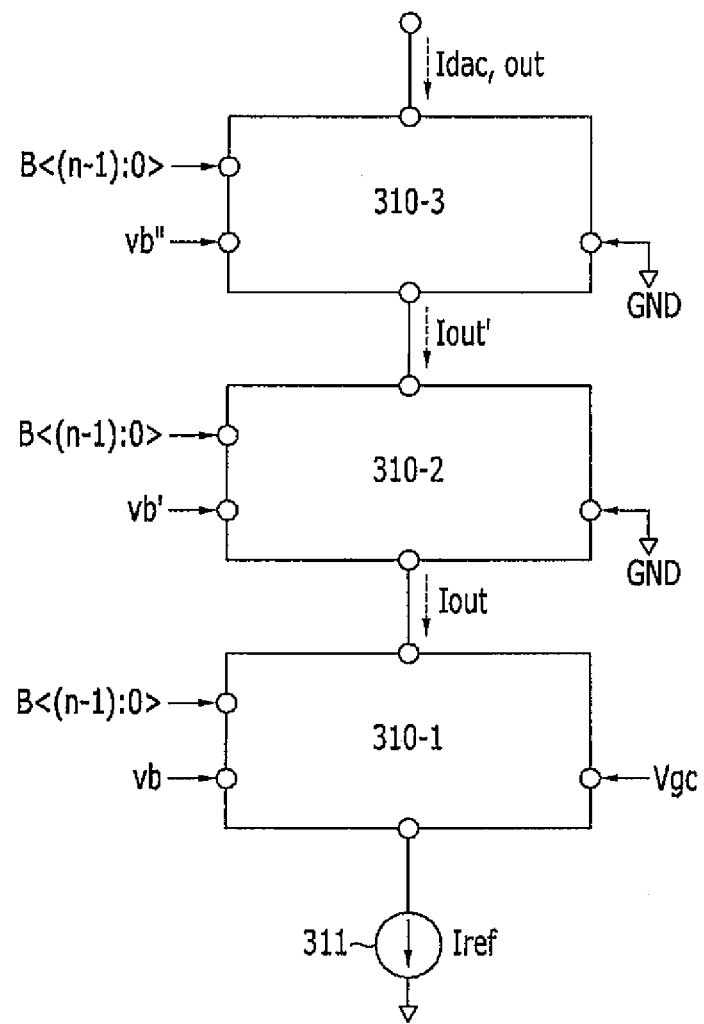
FIG. 5 is a block diagram of a non-linear gamma compensation current mode digital-analog converter according to another example embodiment of the present invention.

FIG. 5 is a block diagram of a non-linear gamma compensation current mode digital-analog converter according to another example embodiment of the present invention.

Referring to FIG. 5, the non-linear gamma compensation current mode digital-analog converter 310 may include three digital-analog converter blocks 310-1, 310-2, and 310-3. That is, compared with FIG. 2, a third digital-analog converter block 310-3 is further included.

The first current Iout flows to the current output terminal of the first digital-analog converter block 310-1 from the second digital-analog converter block 310-2, and the second current Iout' flows from the third digital-analog converter block 310-3 to the current output terminal of the second digital-analog converter block 310-2. The third current Idac,out flows to the current output terminal of the third digital-analog converter block 310-3 and the current amount of the third current Idac,out is changed into the non-linear cube shape for the n bit digital signal(B<(n−1):0).

The third current Idac,out may be represented by Equation 6.

$$Idac, out = Iref\left(\frac{Iout}{2^n}\sum_{k=0}^{n-1} 2^k \cdot B[k]\right)^3 \qquad \text{Equation 6}$$

The third current Idac,out is output as the gray level current of the display device 10, and the gray level current that the non-linear gamma compensation is performed through the non-linear gamma compensation current mode digital-analog converter 310 may be generated.

The configuration of three digital-analog converter blocks 310-1, 310-2, and 310-3 is the same as that of FIG. 3 such that the detailed description is omitted.

Here, the plurality of transistors Mg, Ma, and M(0)-M(n−1) may be n-channel field effect transistors. A gate-on voltage turning on the n-channel electric field effect transistor may be a high level voltage and a gate-off voltage turning it off is a low level voltage. The plurality of transistors Mg, Ma, and M(0)-M(n−1) may be a p-channel field effect transistors, and the gate-on voltage turning on the p-channel electric field effect transistor may be the low level voltage while the gate-off voltage turning it off may be the high level voltage.

On the other hand, at least one of the plurality of transistors Mg, Ma, or M(0)-M(n−1) may be an oxide thin film transistor (an oxide TFT) in which the semiconductor layer is made of the oxide semiconductor.

The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In), and as a composite oxide thereof, one of zinc oxide (ZnO), indium-gallium-zinc oxide (In- GaZnO4), zinc-indium oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin—aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) may be used.

The semiconductor layer includes a channel region not doped with an impurity and a source region and a drain region formed at both sides of the channel region to be doped with an impurity. Herein, the impurity is changed according to a kind of thin film transistor, and an N-type impurity or a P-type impurity may be applied.

When the semiconductor layer is made of an oxide semiconductor, an additional protection layer may be added in order to protect the oxide semiconductor that is vulnerable to external environment factors, such as a high temperature.

The above-referenced drawings and the described detailed description of the invention are only illustrative for embodiments of the present invention, which are used only for the purpose of describing the present invention but are not used to restrict the meaning or limit a range of the present invention described in claims, or their equivalents. Therefore, it will be understood by those skilled in the art that various modifications and other equivalent example embodiments may be possible. Accordingly, the true technical protection range of the present invention may be defined depending on the technical spirit of the accompanying claims, and their equivalents.

DESCRIPTION OF SYMBOLS

10: display device
100: signal controller
200: scan driver
300: data driver
400: power source supply unit
600: display unit
310: non-linear gamma compensation current mode digital-analog converter
310-1: first digital-analog converter block
310-2: second digital-analog converter block
310-3: third digital-analog converter block

What is claimed is:

1. A non-linear gamma compensation current mode digital-analog converter comprising:
a first digital-analog converter block comprising a first node and a second node different from the first node, the first digital-analog converter block being configured to:
receive a digital signal, a first reference voltage, and a gamma adjustment voltage; and
provide a reference current to a ground through the first node of the first digital-analog converter block, wherein a first current flowing to the second node of the first digital-analog converter block is determined according to the digital signal and the gamma adjustment voltage; and
a second digital-analog converter block comprising a third node and a fourth node different from the third node, the second digital-analog converter block being configured to:
receive the digital signal, a second reference voltage, and a ground voltage; and
provide the first current between the third node, the first node being different from the third node, wherein a second current flowing to the fourth node is determined according to the digital signal and the first current.

2. The non-linear gamma compensation current mode digital-analog converter of claim 1, wherein
the first digital-analog converter block comprises:
a plurality of first switches coupled to the second node of the first digital-analog converter block;
a plurality of second switches coupled to a power source voltage; and
a plurality of bit current transistors comprising a gate electrode coupled to the first reference voltage, wherein the plurality of bit current transistors are coupled between:
the plurality of first switches and the plurality of second switches; and
a reference current terminal configured to receive the reference current.

3. The non-linear gamma compensation current mode digital-analog converter of claim 2, wherein
the first digital-analog converter block further comprises a unit current transistor comprising a gate electrode coupled to the first reference voltage, wherein the unit current transistor is coupled between the power source voltage and the reference current terminal.

4. The non-linear gamma compensation current mode digital-analog converter of claim 3, wherein
the first digital-analog converter block further comprises a gamma adjustment transistor comprising a gate electrode coupled to the gamma adjustment voltage, wherein the gamma adjustment transistor is coupled between the second node of the first digital-analog converter block and the reference current terminal.

5. The non-linear gamma compensation current mode digital-analog converter of claim 4, wherein
the plurality of first switches are configured to be turned on/off in response to the digital signal and the plurality of second switches are configured to be turned on/off in response to a reverse phase signal of the digital signal.

6. The non-linear gamma compensation current mode digital-analog converter of claim 5, wherein the unit current transistor is configured to provide a unit current according to the first reference voltage.

7. The non-linear gamma compensation current mode digital-analog converter of claim 6, wherein
the plurality of bit current transistors are configured to provide a current of $2^{n-1}$ times the unit current according to positions arranged corresponding to the digital signal.

8. The non-linear gamma compensation current mode digital-analog converter of claim 6, wherein
a ratio of a channel width and a channel length of the plurality of bit current transistors is $2^{n-1}$ times a ratio of a channel width and a channel length of the unit current transistor according to positions arranged corresponding to the digital signal.

9. The non-linear gamma compensation current mode digital-analog converter of claim 8, wherein
a ratio of a channel width and a channel length of the gamma adjustment transistor is $2^n$ times the ratio of a channel width and a channel length of the unit current transistor.

10. The non-linear gamma compensation current mode digital-analog converter of claim 9, wherein
the second digital-analog converter block comprises a same arrangement as the first digital-analog converter block, and the gate electrode of the gamma adjustment transistor of the second digital-analog converter block is configured to receive the ground voltage.

11. The non-linear gamma compensation current mode digital-analog converter of claim 4, wherein
the gamma adjustment voltage is adjusted with a ratio of which the reference current is divided into a current flowing to the plurality of bit current transistors and a current flowing to the gamma adjustment transistor.

12. The non-linear gamma compensation current mode digital-analog converter of claim 1, further comprising
a third digital-analog converter block configured to receive the digital signal, a third reference voltage, and the ground voltage, and to output the second current to the second digital-analog converter, wherein a third current provided to a third current output terminal is determined according to the digital signal and the second current.

13. A display device comprising:
a plurality of pixels; and
a data driver comprising a digital-analog converter configured to convert a digital image signal into an analog gray level current and to apply the gray level current to a plurality of data lines coupled to the plurality of pixels,
wherein the digital-analog converter comprises
a first digital-analog converter block comprising a first node and a second node different from the first node, the first digital-analog converter block being configured to receive the image signal, a first reference voltage, and a gamma adjustment voltage, and to provide a reference current to a ground through the first node of the first digital-analog converter block, wherein a first current provided to the second node of the first digital-analog converter block is determined according to the image signal and the gamma adjustment voltage; and
a second digital-analog converter block comprising a third node and a fourth node different from the third node, the second digital-analog converter block being configured to receive the image signal, a second reference voltage, and a ground voltage and to provide the first current between the third node and the second node, the first node being different from the third node, wherein a second current provided to the fourth node is determined according to the image signal and the first current.

14. The display device of claim 13, wherein
the first digital-analog converter block comprises:
a plurality of first switches coupled to the second node of the first digital-analog converter block;
a plurality of second switches coupled to a power source voltage; and
a plurality of bit current transistors comprising a gate electrode coupled to the first reference voltage and coupled between the plurality of first switches and the plurality of second switches, and a reference current terminal configured to receive the reference current.

15. The display device of claim 14, wherein:
the first digital-analog converter block further comprises a unit current transistor comprising a gate electrode coupled to the first reference voltage and coupled between the power source voltage and the reference current terminal.

16. The display device of claim 15, wherein
the first digital-analog converter block further comprises a gamma adjustment transistor comprising a gate electrode coupled to the gamma adjustment voltage and coupled between the second node of the first digital-analog converter block and the reference current terminal.

17. The display device of claim 16, wherein
the plurality of first switches are configured to be turned on/off in response to the digital image signal and the plurality of second switches are configured to be turned on/off in response to a reverse phase signal of the digital image signal.

18. The display device of claim 17, wherein
the unit current transistor is configured to provide a unit current according to the first reference voltage.

19. The display device of claim 16, wherein
the gamma adjustment voltage is adjusted with a ratio of which the reference current is divided into a current flowing to the plurality of bit current transistors and a current provided to the gamma adjustment transistor.

20. The display device of claim 13, wherein
the digital-analog converter further comprises
a third digital-analog converter block configured to receive the digital image signal, a third reference voltage, and the ground voltage and to provide the second current to the second digital-analog converter, wherein a third current flowing to a third current output terminal is determined according to the digital image signal and the second current.

* * * * *